United States Patent [19]

Feinberg et al.

[11] 4,175,246

[45] Nov. 20, 1979

[54] ENERGIZING CIRCUIT FOR MAGNETRON USING DUAL TRANSFORMER SECONDARIES

[75] Inventors: Albert E. Feinberg; Kenneth Woo, both of Chicago, Ill.

[73] Assignee: Advance Transformer Company, Chicago, Ill.

[21] Appl. No.: 881,626

[22] Filed: Feb. 27, 1978

[51] Int. Cl.² .................. H05B 39/00; H05B 41/14
[52] U.S. Cl. ............................ 315/101; 315/105; 315/277; 315/278; 315/DIG. 5; 315/DIG. 7; 331/86
[58] Field of Search .............. 315/101, 105, 277, 278, 315/279, 282, 254, 255, 265, DIG. 5, DIG. 7; 331/86, 87

[56] References Cited

U.S. PATENT DOCUMENTS

| | | | |
|---|---|---|---|
| 3,569,855 | 3/1971 | Noda | 331/86 |
| 3,584,288 | 6/1971 | Boehm | 328/262 |
| 3,702,969 | 11/1972 | Maillot | 315/101 |
| 3,760,291 | 9/1973 | Levinson | 331/86 |
| 3,873,883 | 3/1975 | Sievers et al. | 315/105 |
| 3,902,099 | 8/1975 | Feinberg | 315/277 |

*Primary Examiner*—Saxfield Chatmon, Jr.
*Attorney, Agent, or Firm*—Silverman, Cass & Singer, Ltd.

[57] ABSTRACT

A magnetron energizing circuit preferably uses two transformers of the high leakage reactance type having isolated secondaries with an end terminal of each secondary connected to a common point which is at ground potential. The secondaries are connected to series condensers in two loops which provide leading current flowing in the secondaries at all times while both are connected in the circuit to produce saturation in the respective cores of the secondaries whereby to achieve substantially constant current and good regulation for variations in the primary voltage. A single magnetron is served by the circuit and variations in the loading of the magnetron are also compensated for by virtue of the substantially constant current circuit. The secondaries are connected in opposite phase with respect to the respective capacitors which they serve to charge to obtain a full wave doubler operation when the transformers are both in circuit but with low peak current. The combined secondaries and condensers are connected through a rectifier or rectifiers to a magnetron used for heating purposes, the magnetron participating in the overall operation of the circuit and being of the continuous wave pulsed type so as to achieve heating in cooking ovens or the like.

Disconnecting one of the transformers from the circuit converts the circuit into a low power, but efficient half wave voltage doubler circuit.

Isolating rectifiers prevent circulating currents.

A modified form uses a single transformer having two isolated secondaries.

16 Claims, 6 Drawing Figures

ENERGIZING CIRCUIT FOR MAGNETRON USING DUAL TRANSFORMER SECONDARIES

BACKGROUND OF THE INVENTION

The invention herein relates to magnetron energizing circuits for providing pulsed d.c. power to a magnetron from a relatively low frequency low voltage a.c. power source.

U.S. Pat. No. 3,396,342 and 3,902,099 are hereby incorporated herein by reference for the disclosures thereof.

The first of these patents discloses the theory of operation of the basic circuit utilizing the principles which are applied in this invention. The second of these patents discloses circuitry to enable two relatively small transformers to be used for achieving a higher power output by connecting them in parallel to operate suitable circuitry energizing a single magnetron.

The problem with the circuitry of the second patent has been that the peak currents which result are twice those which would occur through the use of a single transformer and the related circuit as taught therein. In each case the secondaries of the transformers were connected in parallel, resulting in their being phased in the same direction relative to the charging of the capacitors they served. In the invention herein, by connecting the secondaries in opposite directions with respect to the charging of the condensers they serve there has been achieved a distinct advantage which consists of a much lower peak current.

Specifically, the circuit as connected in accordance with the invention provides practically double power because of full wave pulsing but the peak currents are the same as though only one transformer were used. Further, the circuit can be converted from a full wave voltage doubler circuit into a half wave voltage doubler circuit merely by throwing a switch which cuts out one of the transformers and half of the circuit. This enables the achievement of low power, as for example, when it is desired to defrost food or cook at a low heat.

One of the most important aspects of the invention lies in the provision of a half wave voltage doubler magnetron energizing circuit in which the transformer expense is substantially decreased by using one or two economical transformers instead of one very expensive transformer. The circuit which uses two transformers then has the additional advantage mentioned above, namely, it can be switched to a half wave voltage doubler circuit; however, the switching is done at a very low voltage part of the circuit.

Looking at the conventional full wave voltage doubler circuit, the transformer secondary is at high potential at both terminal ends. Building a transformer for handling thousands of volts in the secondary winding calls for very expensive procedures. The problem is a practical one because the start of the coil of wire that forms the secondary is very close to the steel core if the coil window fits the core closely. This can result in arcing unless very expensive insulation is used, and even then there is no assurance that arcing will not occur where peaks of voltage are inordinately high during switching.

On this account, notwithstanding the benefits of full wave doubler circuits—i.e., greater power with low peak currents if the technique of U.S. Pat. No. 3,396,342 is used, these circuits are not as popular as the half wave voltage doubler circuit (FIG. 5 of U.S. Pat. No. 3,396,342). The full wave rectifier circuit (FIG. 2 of U.S. Pat. No. 3,396,342) has the same disadvantage as the full wave doubler circuit in requiring a fully insulated secondary winding.

It should be mentioned that the most usual method of building a transformer for use in a circuit which requires a fully insulated secondary winding is to make the coil window substantially larger than the core cross section so that the corner of the coil where greatest voltage stress occurs is spaced from the steel core.

In the case of the normal half wave voltage doubler circuit, one end of the transformer is rounded. This makes the construction of the transformer very economical because there is no difficulty in achieving sufficient insulation for the start of the coil at the corner.

The invention preferably utilizes two of these transformers, there being a wide variety of them commercially available and easily adaptable to the circuit of the invention using almost any type of magnetron or power requirements. It may seem anomolous, but the fact is that at the present time the cost of the two transformers with grounded end terminals on their secondaries may be less than the cost of a transformer with the secondary insulated for use with the same type of circuit. This presumes availability of the latter type of transformer which at the present time is questionable. Rectifiers required for the circuit of the invention are not a factor of added expense since they are commonly available at low cost.

The possibility exists of switching the known full wave voltage doubler to have it operated at half power as a half wave voltage doubler, but this is not practical because the switching must be done at high voltage. The invention provides low voltage switching with consequent elimination of the difficulty and expense of high voltage switching means.

Instead of two transformers with grounded secondaries the circuit can be used with one transformer having two secondaries that are grounded at respective terminal ends. This latter transformer can be built using production techniques with resulting economy so that the benefits of a full wave voltage doubler circuit is more readily available for low cost microwave ovens. Use of a transformer with only a single primary winding does not permit low voltage switching from full wave voltage doubler operation to half wave voltage doubler operation.

SUMMARY OF THE INVENTION

A magnetron energizing circuit in which two secondary windings of one or two respective transformers are connected to serve a single magnetron, the transformers being of the high leakage reactance type and the circuitry being connected in a substantially constant current mode, with the capacitive reactance being greater than the leakage reactance of the transformers so that a leading current flows in the secondary circuit. Return path means are provided for the flow of current under conditions where the polarity permits to provide a continuous a.c. in the secondary circuit for both loops alternately in the case of a full wave voltage doubler, and where the magnetron does not conduct on half cycles in the case of a half wave voltage doubler.

The secondaries are connected in series and poled the same with respect to a loop containing the both return paths albeit the return paths are unidirectional opposing one another, the secondaries being poled opposite to the direction of charging current of the respective capacitors they serve. The transformer construction in either case is economical in having a terminal end of each secondary at ground potential.

When both secondaries are connected in circuit, the circuit acts as a full wave doubler. If two independent transformers are used, when one transformer is connected in circuit the circuit acts as a half wave voltage doubler. Rectifiers prevent unwanted circulating current but have no effect on the operation of the apparatus. Peak currents are no greater for the full wave voltage doubler circuit than for the half wave voltage doubler circuit.

There may be a separate magnetron filament transformer but it is preferred to have a filament winding associated with the single transformer primary or one of the primaries if two transformers are used.

DESCRIPTION OF THE PREFERRED EMBODIMENTS

Figure 1:
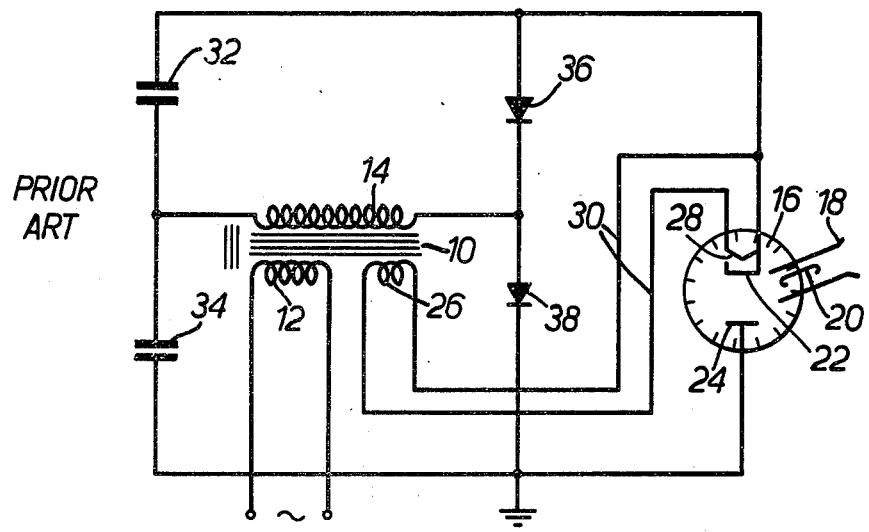
FIG. 1 is a diagram of a prior art full wave voltage doubler circuit for energizing a single magnetron.
Figure 2:
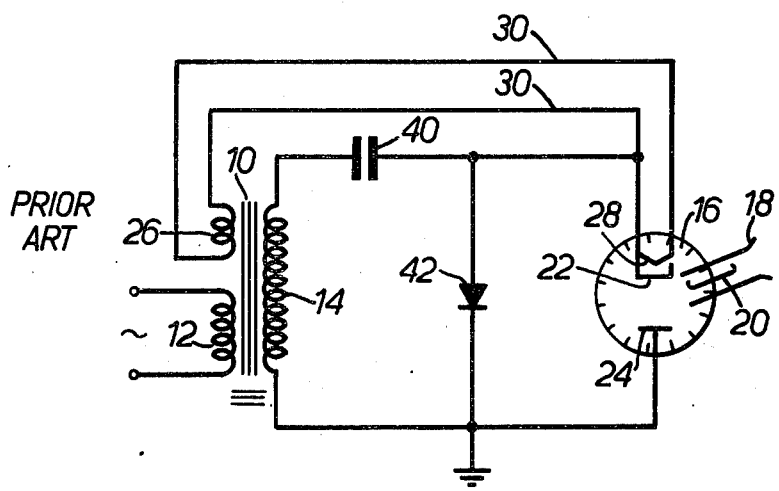
FIG. 2 is a diagram of a prior art half wave voltage doubler circuit for energizing a single magnetron.

FIGS. 1 and 2 comprise prior art circuits, the first being a full wave voltage doubler and the second being a half wave voltage doubler. In each case there is a single high leakage reactance transformer 10 having a primary winding 12 and a secondary winding 14, the primary winding being connected to a source of a.c. power such as for example a 60 hertz 120 volt power line. Each circuit serves a continuous wave magnetron 16 of the type which is designed to be energized by pulsed d.c. to produce high frequency microwave energy coupled to a wave guide 18 by means of a probe 20. The cathode 22 of the magnetron is at high voltage relative to the anode 24 which is at ground potential, as conventional. A heater winding 26 closely coupled to the primary winding 12 provides the power to drive the filament 28 by way of the leads 30.

In the case of the full wave voltage doubler of FIG. 1, the condensers are 32 and 34 and the return path rectifiers are 36 and 38. The pulsed d.c. applied to the magnetron is full wave, that is, a pulse for each half cycle of the a.c. applied to the primary winding 12, the inversion of alternate half cycles being effected by the well-known mechanism which results from the circuit.

The half wave voltage doubler circuit of FIG. 2 operates in the usual manner known for such circuits, there being a charging capacitor 40 and a return path rectifier 42. The magnetron 16 in this case is energized by only half cycles of voltage, the alternate half cycles being ineffective due to the diode action of the magnetron, the current passing through the rectifier 42 on these alternate half cycles.

In any case, the total capacitive reactance represented in each circuit is in excess of the leakage reactance of the transformer so that there is a leading current in the secondary circuit, and the bypassing elements or return path rectifiers ensuring that a.c. always flows in the secondary circuit.

In the circuit of FIG. 1 it is to be noted that the transformer 10 is required to have the secondary 14 insulated from ground potential which will be the steel core. This very substantially increases the expense of building the transformer. Magnetrons of the type used with microwave ovens at the present time operate at thousands of volts and the secondary 14 must be insulated accordingly.

Inserting a switch in either loop branch of the circuit of FIG. 1 to make the circuit adaptable for half wave operation is impractical because of the high voltages involved. Arcing and surges due to transients can damage transformer and/or magnetron.

The circuit of FIG. 2 is a well-known circuit and the secondary 14 is grounded at one end. This type of transformer is highly economical to build and is available commercially all over the world for almost any parameters of half wave doubler circuit.

According to the invention the benefits of using a full wave voltage doubler are achieved through the use of a novel circuit which employs two secondary windings, one for each loop of the half wave voltage doubler circuit in which one terminal end of each secondary is at ground potential. This is effected by connecting the secondaries in the circuit so they are poled oppositely, instantaneous voltage-wise, relative to their respective charging condensers thereby enabling one side of each secondary winding to be grounded.

As a result of this, the secondary windings may be mounted on economical transformers, either on the same core with one primary winding serving both secondaries or on separate cores with an independent primary winding for each secondary. The latter is preferred because this type of transformer is readily available commercially at extremely low cost and because it enables low voltage switching to cut out one primary winding for conversion of the circuit to a half wave voltage doubler, if desired.

Figure 3:
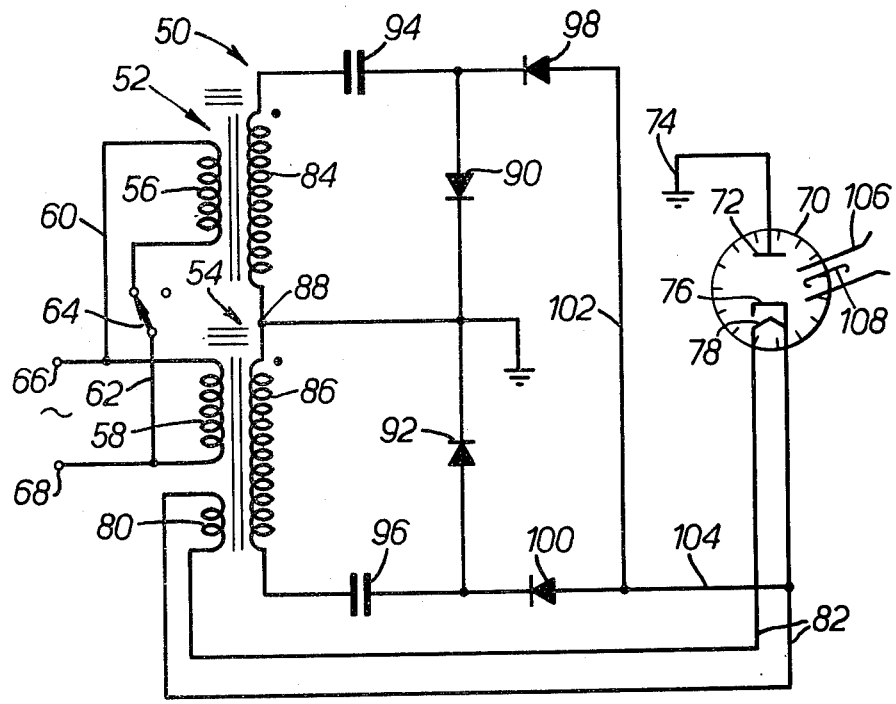
FIG. 3 is a diagram of the circuit of the invention which uses two separate transformers and showing that when both transformers are connected the circuit comprises a full wave voltage doubler circuit for energizing a single magnetron.
Figure 4:
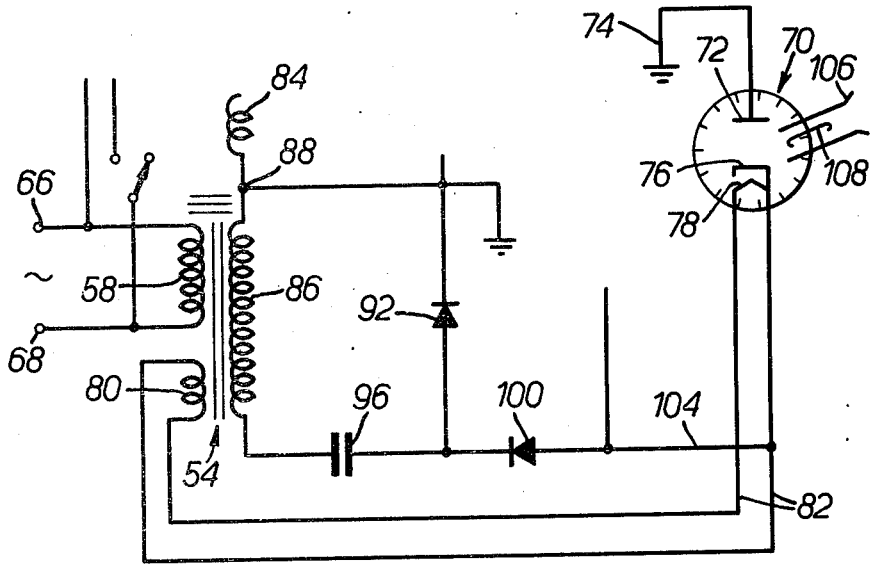
FIG. 4 is a diagram of the effective circuit which remains operative out of the circuit of FIG. 3 after disconnecting one of the transformers and showing that the circuit has been converted to a half wave voltage doubler circuit for energizing a single magnetron.

The circuit 50 of FIG. 3 uses two very economical transformers 52 and 54 instead of one expensive one which would be required for FIG. 1, and the elements are arranged in a full wave voltage doubler configuration which includes two isolating rectifiers to prevent circulating current from returning to the capacitors and preventing proper operation of the circuit. The primary windings 56 and 58 of the transformers 52 and 54 are connected in parallel by means of the leads 60 and 62 but there is a single pole single throw switch 64 in the lead 62. The transformer 54 is connected directly to the power line by way of the terminals 66 and 68 and it should be clear that if the switch 64 is opened (as shown in FIG. 4) the primary winding 56 is deenergized, but the primary winding 58 is still connected to the power line. This switching, if done, is effected at low voltage, usually 120 volts.

The magnetron which the circuit 50 serves to energize is shown at 70 and it comprises an anode 72 which is grounded at 74 and a cathode 76 which is heated by a filament 78 that in turn is energized by the filament winding 80 through the leads 82. Since the filament winding 80 is coupled to the primary winding 58 of the transformer 54 which is always energized, it is immaterial whether the switch 64 is open or closed insofar as energization of the filament 78 is concerned.

The secondary windings 84 and 86 are connected effectively in series, their connecting common terminal 88 being grounded. The return path rectifiers 90 and 92 are connected opposite to one another so that the series condensers 94 and 96 charge in opposite directions relative to the polarity of the secondary windings as indicated by the polarity dots. The rectifiers 98 and 100 have their anodes connected in common to the cathode 76 by the leads 102 and 104. The microwave energy from the magnetron 70 is coupled to a wave guide 106 by the probe 108.

The circuit 50' of FIG. 4 is the lower half of the circuit 50 of FIG. 3. The elements are identified by the same reference characters. The switch 64 is shown open as a result of which the circuit becomes simply a half wave voltage doubler with an isolating rectifier 100. The operation of this circuit is well-known.

The advantages of the circuit are as follows:
A. A full wave voltage doubler effect is achieved but without the need for an expensive transformer that requires high voltage insulation for the secondary winding at its start and inner corners of its coil.
B. The full wave operation is achieved, with equivalent outputs, with peak currents lower than those of the circuits of U.S. Pat. No. 3,902,099.
C. Two transformers of highly economical construction and ready availability are used.
D. The circuit is easily switched at low voltage from full wave voltage doubler configuration to half wave voltage doubler configuration for half power operation.

In the case where two commercial transformers are used for transformers 52 and 54, there may be a filament winding like 80 included with both. It is a simple matter to leave the connections to the filament winding of transformer 52 open. If desired, the transformer 52 can be specified not to include a filament winding and the manufacturer will not be required to make any change of moment in his manufacturing procedure other than to eliminate a few operations.

In a practical circuit, good results were achieved where the condensers 94 and 96 were each 0.41 microfarads; the magnetron 70 was a Raytheon 1 KW magnetron having a peak input voltage of 4000; the transformers 52 and 54 were of a commercial type construction for half wave voltage doubler circuits having a 120 volt a.c. primary winding and about a 2200 volt secondary winding; the rectifiers were all Varo H402. Current regulation under load was about 11.5% centered around 120 volts a.c. It should be recalled that it is essential for best magnetron operation that the magnetron current have flat peaks and not vary substantially; hence the circuit must be constructed to meet the criteria of U.S. Pat. No. 3,396,342 especially in that the current must always be leading in the secondary circuit of each transformer.

Figure 5:
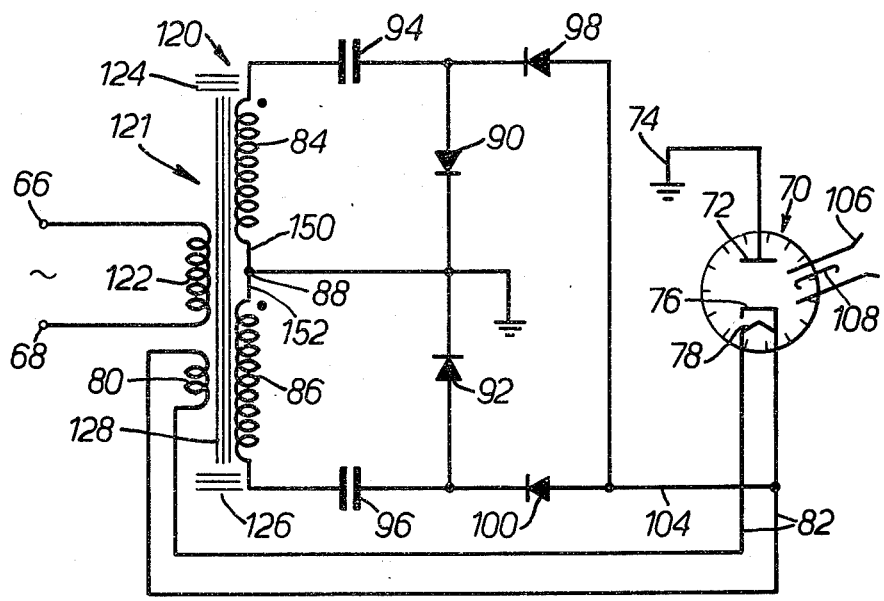
FIG. 5 is a diagram which is the same as that of FIG. 3 but which illustrates a modified form of the invention, differing from FIG. 3 in having a single transformer with one primary winding and two secondary windings.

The invention may be embodied in another form which is illustrated as the circuit 120 of FIG. 5. Some of the advantages of the circuit 50 of FIG. 3 are not available for the circuit 120. The full wave voltage doubler action of the circuit 120 is identical to that of the circuit 50. Accordingly the same components are found to the right of the transformer 121 and they bear the same reference numerals as in FIG. 3. Even the secondary windings 84 and 86 function in the same manner as those of the circuit 50.

The difference between circuits 50 and 120 lies in the construction of the transformer means. In circuit 120 there is a single transformer using a unitary core 128 which may be constructed as will be explained in connection with FIG. 6. (The word "unitary" is intended to mean a single assembly). The core 128 mounts a primary winding 122 which is adapted to be connected to an a.c. line by way of terminals 66 and 68 just as in the case of both primaries of circuit 50. The core 128 also mounts the two secondary windings 84 and 86, each being in high leakage reactance coupling relationship to the common primary winding 122 as indicated by the shunt symbols 124 and 126. There may again be a filament winding 80 on the core 128 closely coupled to the primary winding 122.

The secondary side operation of circuit 120 is identical to that of circuit 50; hence no further explanation is needed. The advantage of using the two highly economical commercially obtainable transformers 52 and 54 is not available for this circuit 120. The advantage of being able to convert from a full wave voltage doubler circuit to a half wave voltage doubler circuit by low voltage switching is also not available here.

It is practicable to construct a transformer 121 for circuit 120 in an economical manner using well-known techniques. This could give advantages over the use of two transformers like 52 and 54 if made in quantity and would also provide many advantages over the circuit of FIG. 1 because of the elimination of insulating problems.

Figure 6:
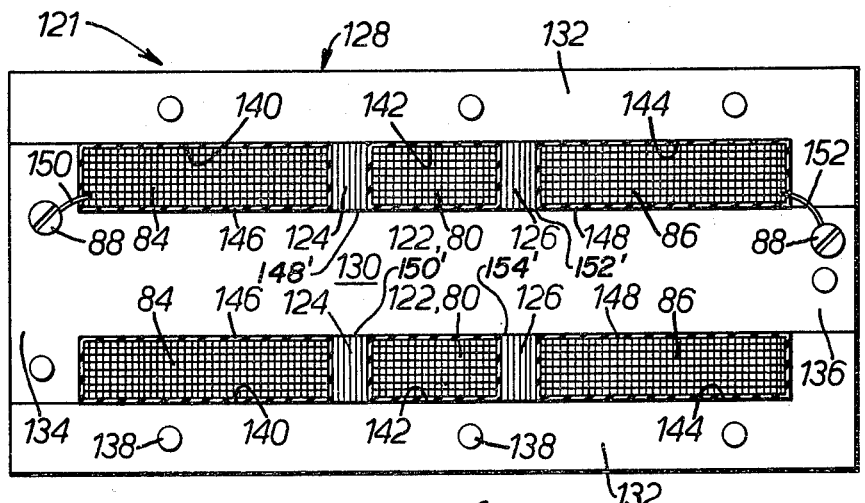
FIG. 6 is a diagrammatic view, partly in elevation and partly in section illustrating the general construction of a transformer suitable for use with the circuit of FIG. 5.

In FIG. 6 the transformer 121 is based upon a laminated steel core 128 formed of stacked T's and L's which provide a frame type of core. There is a central winding leg 130, outer elongate framing members 132 and bridging ends at 134 and 136. The stacks of laminations are held together by rivets such as 138 or welding. Scrapless punching techniques which are known may be used to form the laminations.

The spaces between the central winding leg 130 and the outer elongate framing members 132 are divided into windows 140, 142 and 144 by shunts 124 and 126. These shunts may be formed by assembling bundles of lamination rectangles and forcing the bundles in place after the coils are mounted. The coils are tubular, as conventional, with rectangular cross sections and are of configuration to fit the windows so that the winding leg 130 is coaxial with each coil.

The coils comprise the secondary winding 84 on the left, the primary winding 122 in the center and the secondary winding 86 on the right. If a filament winding 80 is used it will be wound on top of the primary winding and be located also in window 142. The coupling between primary winding 122 and the respective secondary windings 84 and 86 is quite loose, resulting from the presence of the shunts 124 and 126 and whatever gaps may be worked into the respective magnetic circuits as indicated at 148', 150', 152' and 154'. The degree of leakage reactance is required to be substantial as explained in said U.S. Pat. No. 3,396,342 and can be achieved by adjustment of physical parameters by those skilled in the art of building high leakage reactance transformers. The dimensions of the physical transformer can be easily related to the dimensions of the commercially available transformers 52 and 54. These latter transformers designed for use with half wave voltage doubler circuits for energizing magnetrons like FIG. 2 are available in the U.S. at the present time. The core 128 would have physical dimensions somewhat less than twice the size of any of these commercially available transformers.

The location of the secondaries 84 and 86 at opposite ends of the core 128 and separated from one another by the shunts 124 and 126 and the primary winding 122 provides such decoupling that there will be no effect felt by one upon the other.

The insulation between secondary winding coils and their respective mounting windows 140 and 144 is indicated at 146 and 148. This could be any well-known material such as impregnated cloth, paper, plastic sheeting and the like which will provide the desired anticorona or anti-arcing protection. Since the radially interior layer of turns of each secondary winding 84 and 86 is at ground potential according to the circuit 120, the starting leads 150 and 152 are pulled out and connected to the common juncture point 88 which is at ground potential. This comprises, for example, screw terminals in FIG. 6 metallically engaging the core 128. The insulation 146 and 148 at the critical locations on the coil interiors thus need only be required to withstand very low voltages and the transformer 121 is therefore a highly economical one to build.

Variations are capable of being made without departing from the spirit or scope of the invention as defined in the appended claims.

What it is desired to secure by Letters Patent of the United States is:

1. An operating circuit for energizing a magnetron from an a.c. line of relatively low voltage and frequency which comprises:
   a. a magnetron having an anode and a cathode;
   b. a generally constant current transformer and condenser means combination which includes
      i. transformer means having primary winding means adapted to be connected to said a.c. line;
      ii. said transformer means including two secondary windings each isolated from said primary winding means but coupled in high leakage reactance operating relation to said primary winding means, the secondary windings each having a first terminal at opposite instantaneous polarity with respect to one another connected to a first common juncture which is and remains at ground potential during operation of the circuit; and
      iii. each secondary winding having its second terminal connected through a respective charging condenser and blocking rectifier means to a common second juncture;
   c. the anode and cathode of the magnetron being connected to the combination and to be subjected to the output voltage thereof;
   d. each charging condenser having a first rectifier connected from the condenser to the first common juncture whereby to provide a return path for current on alternate half cycles of the applied voltage with respect to each condenser, there being formed thereby two loops each containing a secondary winding, a charging condenser and a first rectifier;
   e. the magnetron anode being connected to the second juncture;
   f. the circuit acting as a full wave voltage doubler to energize the magnetron, the transformer means and the charging condensers being chosen with such parameters that the current in each loop during operation is leading to provide good regulation of the magnetron current notwithstanding normal variations in the line voltage applied to said primary winding means.

2. The operating circuit as claimed in claim 1 in which said magnetron has a filament and said transformer means have a filament winding closely coupled to said primary winding means.

3. The operating circuit as claimed in claim 1 in which said transformer means comprise a single transformer having a unitary core and said primary winding means comprise a single primary winding mounted on said core, the secondary windings both being mounted on said unitary core in loosely coupled relation to the primary winding and in substantially decoupled relationship to one another.

4. The operating circuit as claimed in claim 1 in which said transformer means comprise two transformers, said primary winding means comprise two primary windings each associated with a respective transformer, each secondary winding is mounted on a separate transformer in loosely coupled relation to the respective primary winding of said separate transformers and the primary windings are connected in parallel and include lead means for connecting both to said a.c. line.

5. The operating circuit as claimed in claim 1 in which said primary winding means include switch means selectively operable to discontinue the coupling between the primary winding means and one of said secondary windings without affecting the coupling between said primary winding means and the other of said secondary windings whereby when said primary winding means are connected to said a.c. line only the said other secondary winding and its loop will be active to energize said magnetron as a half wave voltage doubler circuit operating at reduced power instead of as a full wave voltage doubler circuit.

6. The operating circuit as claimed in claim 4 in which switch means are provided for selectively opening the primary winding of one transformer without affecting the primary winding of the other transformer whereby when the lead means are connected to said a.c. line the circuit will operate as a half wave voltage doubler circuit instead of a full wave voltage doubler circuit.

7. The operating circuit as claimed in claim 6 in which said magnetron has a filament and the said other transformer has a filament winding closely coupled to its primary winding whereby the magnetron filament will always be energized when the lead means are connected to said a.c. line irrespective of whether the switch means have been operated or not.

8. The operating circuit as claimed in claim 1 in which said transformer means comprise a single transformer having a unitary elongate core including at least a central winding leg and said primary winding means comprise a single primary winding mounted in the center of said winding leg, the secondary windings being mounted on opposite ends of the winding leg and each being loosely coupled with the primary winding and separated from one another by the primary winding.

9. In an operating circuit for energizing a magnetron from an a.c. line of relatively low voltage and frequency in which there is a full wave voltage doubler circuit for energizing the magnetron and said full wave voltage doubler circuit including transformer means having primary winding means and secondary winding means, the coupling between the primary winding means and secondary winding means being of a type which provides a high leakage reactance effect in said transformer means when operating, two electrical loops each having a charging condenser and a return path rectifier in said loop and the secondary winding means also being connected in said loops, said loops being coupled to said magnetron through blocking rectifiers to provide full wave d.c. pulses to said magnetron and the condensers being of such capacitance as to provide leading current in said secondary winding means during operation, the invention herein which comprises:

said secondary winding means being poled and connected in said loops so as to charge the condensers in opposite direction and comprising at least one secondary winding having a terminal thereof which is and remains at ground potential during operation of the circuit, the magnetron having an anode at ground potential.

10. The invention as claimed in claim 9 in which said secondary winding means include a second secondary winding, one secondary winding being connected in each loop and the second secondary winding also having a terminal thereof at ground potential.

11. The invention as claimed in claim 9 in which means are provided to deenergize one electrical loop whereby to convert said full wave voltage doubler circuit into a half wave voltage doubler circuit.

12. The invention as claimed in claim 10 in which the grounded terminals of each secondary winding are instantaneously poled opposite one another.

13. The invention as claimed in claim 12 in which the transformer means comprise two separate transformers each having a primary winding and one of the secondary windings mounted thereon.

14. The invention as claimed in claim 13 in which switch means are provided selectively to open one primary winding without affecting the other whereby to deenergize one electrical loop and convert the full wave voltage doubler circuit into a half wave voltage doubler circuit.

15. An operating circuit for energizing a magnetron from an a.c. line of relatively low voltage and frequency which comprises:

a. a magnetron having an anode and a cathode, the anode being at ground potential,
b. two step-up transformers each having a primary winding and means for connecting same to said a.c. line with the primary windings being in parallel,
c. each transformer having a secondary winding isolated from its primary winding but coupled thereto in high leakage reactance operating relation, each secondary winding having a first end terminal at opposite instantaneous polarity connected to a first common juncture which is at ground potential,
d. each secondary winding having its second terminal connected to one terminal of a charging condenser, the other terminal of the charging condenser being connected to and forming a second juncture with a return path rectifier which in turn is connected to said first common juncture, there being two such return path rectifiers and the anodes of each being connected to the respective second junctures while the cathodes of each are connected to the first common juncture,
e. the capacitive reactance of each condenser with respect to leakage reactance of the associated transformer being greater so as to provide a leading current in the secondary winding circuit of said associated transformer and result in substantially constant current notwithstanding normal voltage changes in said a.c. line,
f. each second juncture being connected through a respective blocking rectifier to the cathode of the magnetron the circuit acting during operation as a full wave voltage doubler.

16. The invention as claimed in claim 12 in which switch means are provided for disconnecting one primary winding from said a.c. line while the other is still connected thereto whereby to deenergize the secondary winding of said one primary winding and its condenser and return path condenser and convert the circuit into a half wave voltage doubler circuit.

* * * * *